United States Patent

Watanabe

[11] Patent Number: 5,815,460
[45] Date of Patent: Sep. 29, 1998

[54] MEMORY CIRCUIT SEQUENTIALLY ACCESSIBLE BY ARBITRARY ADDRESS

[75] Inventor: Hiroshi Watanabe, Tokyo, Japan

[73] Assignee: NEC Corporation, Tokyo, Japan

[21] Appl. No.: 769,181

[22] Filed: Dec. 18, 1996

Related U.S. Application Data

[63] Continuation of Ser. No. 495,019, Jun. 27, 1995, abandoned.

[30] Foreign Application Priority Data

Jun. 28, 1994 [JP] Japan ................................. 5-146349

[51] Int. Cl.$^6$ .................................................... G11C 8/00
[52] U.S. Cl. .............................. 365/230.06; 365/189.05
[58] Field of Search ...................... 395/375; 365/230.06, 365/189.05, 230.08

[56] References Cited

U.S. PATENT DOCUMENTS

| | | | |
|---|---|---|---|
| 3,577,189 | 5/1971 | Cocke et al. | 395/375 |
| 5,233,696 | 8/1993 | Suzuki | 395/375 |
| 5,327,390 | 7/1994 | Takasugi | 365/230.06 |
| 5,426,606 | 6/1995 | Takai | 365/230.06 |
| 5,438,668 | 8/1995 | Coon et al. | 395/375 |
| 5,448,528 | 9/1995 | Nagai | 365/230.06 |
| 5,452,261 | 9/1995 | Chung et al. | 365/230.06 |

FOREIGN PATENT DOCUMENTS

| | | |
|---|---|---|
| 0468480 | 1/1992 | European Pat. Off. . |
| 0535670 | 4/1993 | European Pat. Off. . |
| 0575829 | 12/1993 | European Pat. Off. . |
| 4-42490 | 2/1992 | Japan . |
| 6-36560 | 2/1994 | Japan . |
| 6-76563 | 3/1994 | Japan . |

OTHER PUBLICATIONS

Zwie Amitai et al., "Burst Mode Memories Improve Cache Design", *IRE Wescon Conference Record*, vol. 34, Nov. 1990, pp. 29–32.

*Primary Examiner*—A. Zarabian
*Attorney, Agent, or Firm*—Sughrue, Mion, Zinn, Macpeak & Seas, PLLC

[57] ABSTRACT

A memory circuit is comprised of a prefetch predecoder, so that this memory circuit can be sequentially accessed by any addresses. The prefetch predecoder is interposed between an address buffer and a column decoder. Upon receipt of information for indicating lower-digit 3 bits of a column address and a burst length, the prefetch predecoder produces such a predecode address for representing both of a decoded result about this lower-digit 3 bits and another decoded result corresponding to the information indicative of the burst length. In response to a predecode address and an upper-digit bit of the column address, the column decoder simultaneously selects a plurality of column selection lines. As a consequence, both of data to be firstly outputted and data to be subsequently outputted are read out at the same time.

6 Claims, 14 Drawing Sheets

FIG. 10

BURST LENGTH

| A2 | A1 | A0 |     | 2 | 4 | 8 |
|----|----|----|-----|---|---|---|
| 1  | 1  | 1  | (7) | $Y_6, Y_7$ | $Y_7, Y_4$ | $Y_7, Y_0$ |
| 1  | 1  | 0  | (6) | $Y_6, Y_7$ | $Y_6, Y_7$ | $Y_6, Y_7$ |
| 1  | 0  | 1  | (5) | $Y_4, Y_5$ | $Y_5, Y_6$ | $Y_5, Y_6$ |
| 1  | 0  | 0  | (4) | $Y_4, Y_5$ | $Y_4, Y_5$ | $Y_4, Y_5$ |
| 0  | 1  | 1  | (3) | $Y_2, Y_3$ | $Y_3, Y_0$ | $Y_3, Y_4$ |
| 0  | 1  | 0  | (2) | $Y_2, Y_3$ | $Y_2, Y_3$ | $Y_2, Y_3$ |
| 0  | 0  | 1  | (1) | $Y_0, Y_1$ | $Y_1, Y_2$ | $Y_1, Y_2$ |
| 0  | 0  | 0  | (0) | $Y_0, Y_1$ | $Y_0, Y_1$ | $Y_0, Y_1$ |

FIG. 16

(a).....0000 ⎤ CSL0
(b).....0001 ⎦

(c).....0010 ⎤ CSL1
(d).....0011 ⎦

(e).....0100 ⎤ CSL2
(f).....0101 ⎦

(g).....0110 ⎤ CSL3
(h).....0111 ⎦

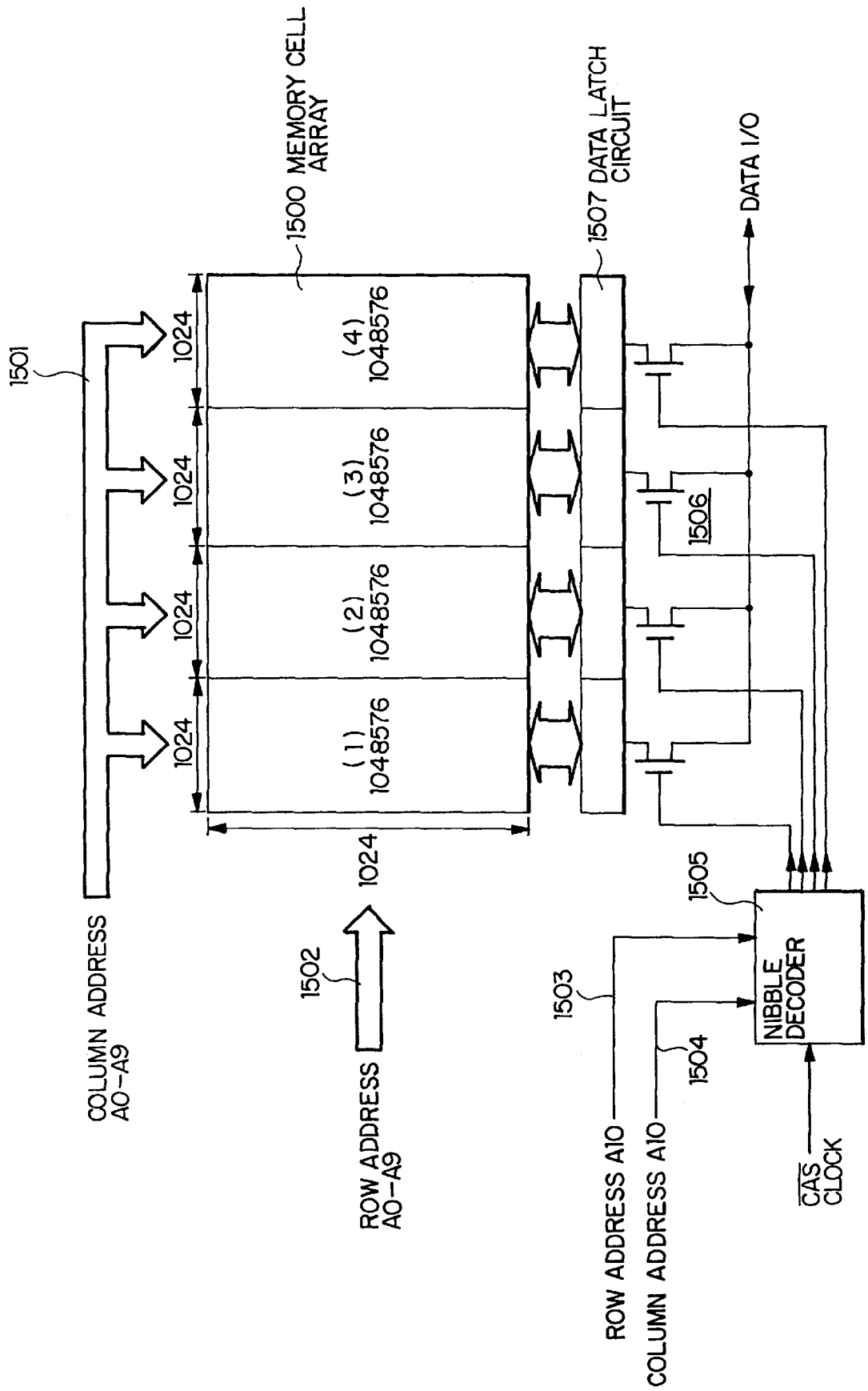

MEMORY CIRCUIT SEQUENTIALLY ACCESSIBLE BY ARBITRARY ADDRESS

This is a Continuation of application Ser. No. 08/495,019 filed Jun. 27, 1995, abandoned.

BACKGROUND OF THE INVENTION 1. (Field of the Invention)

The present invention relates to a memory circuit for performing a sequential access operation.

2. (Description of the Related Art)

Recently, great improvements are made on operation speed of CPUs, and therefore such high speed operations of CPUs can be hardly caught up by access speed of main memory, e.g., DRAMs. In general, to compensate for differences between operation speed of a CPU and access speed of a main memory, a cache memory functioning as a high speed memory is interposed between a CPU and a main memory. In case that such the cache memory is employed, a hit ratio defined when the CPU may access this cache memory is on the order of 90%. As a consequence, a miss hit ratio defined when the CPU has to access a main memory unit is on the order of 10%. Therefore, the CPU may obtain the instruction which the CPU should presently execute (hereinafter referred to as a "CPU instruction") at very high speed.

The reason why such a high hit ratio can be realized is given as follows. This is because when the CPU instruction is not stored in the cache memory and this CPU instruction is read out from the main memory, other instructions which are subsequently stored around the CPU instruction are successively read out following the CPU instruction. This CPU instruction and these successively read instructions are stored in the cache memory. Since it is known from experience that such a high probability when the instructions stored around the CPU instruction are immediately read out to execute by the CPU, very high possibilities that the next CPU instruction has been stored in the cache memory can be expected.

Moreover, as for the above-described other instructions which are subsequently read out from the main memory, a selection is made to such instructions stored at addresses only the lower-digit bits of which are different from the address storing the CPU instruction (hereinafter referred to as a "CPU address"), to easily manage the cache memory by the CPU. As a consequence, the main memory must perform the above-described access operation. That is, the CPU instruction is outputted first thing, and subsequently, the instructions stored at such addresses, only the lower-digit bits of which are different from that of the CPU address, can be continuously outputted in the address sequence at high speed (hereinafter referred to as a "sequential access").

Conventionally, a memory having a nibble mode function is known as a memory capable of performing such a sequential access. Referring now to FIG. 15, a 4-Mbit DRAM (dynamic random access memory) having a nibble mode function will be described.

In FIG. 15, reference numeral 1500 indicates a 4-Mbit memory cell array which is subdivided into four blocks (1), (2), (3) and (4). Each of these blocks has a 1-Mbit capacity, and owns 1024 bit lines and 1024 word lines. The word lines are commonly used in the respective blocks. Reference numeral 1501 represents 10-bit column addresses "A0" to "A9". In accordance with an address value of a column address, one of the 1024 column selection lines CSLs (not shown) is selected. Each of these column selection lines CSLs selects one bit line in each of the blocks. Reference numeral 1502 shows 10-bit row addresses "A0" to "A9". Based on an address value of a row address, one of the 1024 word lines is selected. A nibble decoder 1505 accepts the row address A10 and the column address A10 to decode these addresses, so that one of four selection switches 1506 is selected to be turned ON, and also such selection switches which are turned ON in response to the CAS clock are successively changed.

Next, a description will be made on the reading operation for the 4-Mbit DRAM shown in FIG. 15. First, the column address 1501 and the row address 1502 are supplied, so that one column selection line CSL and one word line are selected. As a consequence, since one bit line and one word line in the respective blocks are selected in each of these blocks, one memory cell is selected to be read in each of these blocks. That is, 4 memory cells are accessed by one column selection line CSL and one word line. The 4 bits data read out from the 4 memory cells are latched by a data latch circuit 1507. Subsequently, in response to the column address A10 and the row address A10, the nibble decoder 1505 turns ON one selection switch among the four selection switches 1506 to output the corresponding data latched in the data latch circuit 1507. Subsequently, in response to the clocking operation of the CAS clock, the nibble decoder 1505 successively turns ON these selection switches 1506, so that the 4 bits data latched in the data latch circuit 1507 are successively outputted.

These 4 bits data are such data, only the column addresses A10 and row addresses A10 of which are mutually different from each other. As a result, a DRAM capable of performing such a nibble mode access can satisfy conditions of the main memory when the cache memory is used.

However, very recently, the number of data continuously outputted (hereinafter referred to as a "burst length") is increased from 4 to 8, or 16. The memory having the nibble mode function as shown in FIG. 15 owns such a problem that since the data to be continuously outputted are entirely read out within one time, when the burst length is increased, a very large quantity of buses and latch circuits should be required. When the burst length is selected to be, for instance, 8, 8 latch circuit are required as well as eight buses because eight memory cells are accessed simultaneously. A total number of the latch circuits and the buses would be, of course increased when not only the burst length becomes long, but also the bit number of data outputted within one time (hereinafter referred to as a "data width") is increased.

On the other hand, a memory having a 2-bit prefetch function has been proposed to avoid such a difficulty. In the 2-bit prefetch function memory, a certain single column selection line CSL is selected to read first 2 burst data. While these 2 burst data are outputted, other column selection lines CSLs are selected to read 2 burst data which should be subsequently outputted. In this method, even when the burst length is increased, since only two burst data are always read out within one time, a total number of buses and latch circuits are not increased.

The accessing conditions by the 2-bit prefetch function will now be explained with reference to FIG. 16.

In FIG. 16, reference symbols (a) to (h) indicate addresses, and reference symbols CSL 0 to CSL 3 shows CSLs for simultaneously selecting the addresses of (a) and (b), (c) and (d), (e) and (f), and also (g) and (h), respectively. As shown in FIG. 16, the addresses, only the least significant bits (LSB) of which are different from each other, are selected by one CSL. As one example, it is assumed that the burst length is selected to be 4 and the inputted CPU address is equal to (c). In this case, CSL 1 is first selected so that the data stored in the addresses (c) and (d) are read out. These read data are latched, while the data are outputted in this order from (c) to (d), the CSL selection is changed from CSL 1 to CSL 0, so that the data stored at the addresses (a) and (b) are read out. Accordingly, the data output sequence is performed from the address (c) via the addresses (d) and (a) to the address (b). In other words, the CPU instruction stored in the CPU address (c) is commenced to be outputted, and then the data at the addresses, only lower-digit 2 bits are different from each other, are outputted in the address order. As described above, the memory having the 2-bit prefetch function can satisfy the conditions of the main memory when the cache memory is used.

However, as apparent from FIG. 16, the following problems are produced since the two burst data read out by a single column selection line CSL are fixed to a preselected pair of data. That is, when the CPU address is (d), the column selection line CSL 1 is selected to access the data stored in the addresses (c) and (d). When this data at the address (d) is outputted, there is no way other than the data stored in the address (c) is outputted, so that it is not possible to output the data in such an address sequence from the address (d) via the addresses (a) and (b) to the address (c). Similarly, although the data can be outputted in such an address sequence from the address (e) via the addresses (f) and (g) to the address (h), the data cannot be outputted in another address sequence from the address (f) via the addresses (g) and (h) to the address (e). In other words, it could be understood that although the sequential access is available from the even-numbered address, the sequential access is not available from the odd-numbered address.

Moreover, another 2-bit prefetch pipeline method may be conceived in that since two sets of 2-bit prefetch circuits are employed, the sequential access from the odd-numbered address is available. However, this 2-bit prefetch pipeline method necessarily owns such a problem that a total number of latch circuits and buses is increased.

SUMMARY OF THE INVENTION

Therefore, an object of the present invention is to provide an improved memory circuit capable of performing a sequential access.

Another object of the present invention is to provide such a memory circuit capable of performing a sequential access from an arbitrary address without requiring large quantities of latch circuits and buses.

A memory circuit according to the present invention comprises a means for simultaneously selecting a plurality of column selection lines CSLs. This selection means simultaneously selects both of a column selection line CSL corresponding to a CPU address and another column selection line CSL corresponding to an address of data which should be subsequently outputted upon receipt of information indicating the entered CPU address and also the entered burst length.

That is, in the memory circuit according to the present invention in one preferred mode, a decoder circuit for decoding an input signal composed of a plurality of bits and producing a first decoded signal and a second decoded signal that is different from the first decoded signal, the decoder circuit comprises: first means for dividing the input signal into first and second parts, second means for responsive to the input signal for producing said first decoded signal, third means for changing a content of the first part of the input signal to produce an intermediate signal, and fourth means responsive to the second part of the input signal and said intermidiate signal for producing the second decoded signal.

That is, in the memory circuit according to the present invention, since a plurality of column selection lines CSLs each of which is used to access only one burst memory cell are selected at the same time, the data to be prefetched can be arbitrarily combined with each other, and then there is no limitation in a sequence to output the prefetched data. As a consequence, the sequential access form an arbitrary address is available without increasing the number of buses and latch circuits. Accordingly, the memory circuit according to the present invention is suitably used as a synchronous memory.

BRIEF DESCRIPTION OF THE DRAWINGS

The above and other objects, advantages and feature of the present invention will be more apparent from the following description taken in conjunction with the accompanying drawings, in which:

FIG. 10 shows a predecode address produced by the prefetch predecoder 104 indicated in FIG. 2;

FIG. 15 shows the diagram of the conventional memory circuit with the nibble mode function; and FIG. 16 shows the relationship between the column selection lines CSLs and the addresses accessed by these column selection lines employed in the conventional memory with the 2-bit prefetch function.

DETAILED DESCRIPTION OF THE PREFERRED EMBODIMENTS

In a memory circuit according to an embodiment of the present invention, 2 column selection lines CSLs each accesses only memory cells storing data outputted at 1 output timing (1 burst) are selected at the same time, so that data to be outputted at 2 output timing (2 burst) are read out at one time.

Figure 1:
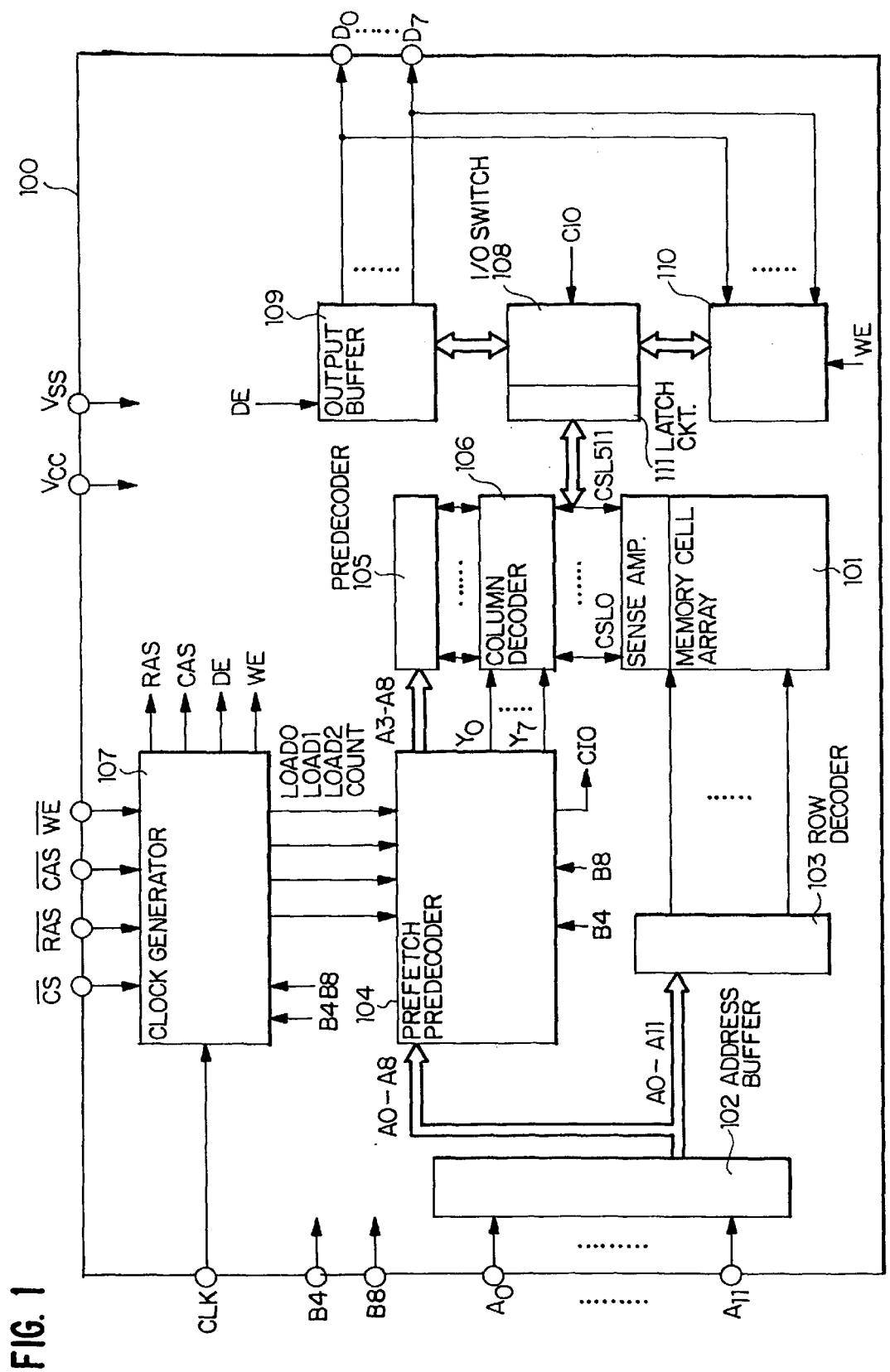
FIG. 1 shows a circuit diagram of a 16 Mbit DRAM 100 corresponding to a memory circuit according to an embodiment of the present invention.

The 16 Mbit DRAM 100 indicated in FIG. 1 is integrated on a semiconductor chip. The 16 Mbit DRAM 100 has a 16 Megabit memory cell array 101. 16 Mega pieces of memory cells are accessed by 4096 word lines and 512 column selection lines CSLs (CSL 0 to CSL 511). As a result, 8 memory cells are accessed by one word line and one column selection line CSL. Therefore, the data width is 8 bits.

Address signals A0 to A11 supplied to an address buffer 102 are entered into a row decoder 103, and address signals A0 to A8 are entered into a prefetch predecoder 104. The row decoder 103 selects one word line in response to the values of the address signals A0 to A11. The prefetch predecoder 104 supplies the address signals A3 to A8 to a predecoder 105, predecode address signals Y0 to Y7 to a column decoder 106, and a selection signal CIO to an I/O switch 108, in response to the values of the address signals A0 to A8, and various timing signals and burst signals B4, B8 supplied from a clock generator 107. In response to the values of the address signals derived from the prefetch predecoder 104 and the predecoder 105, the column decoder 106 selects the column selection lines CSLs. The memory cell accessed by these selected word line and column selection line CSL is connected to a latch circuit 111. The latch circuit 111 is connected to input/output terminals D0 to D7 under control of the I/O switch 108 and the level of the control signal supplied from the clock generator 107.

Figure 2:
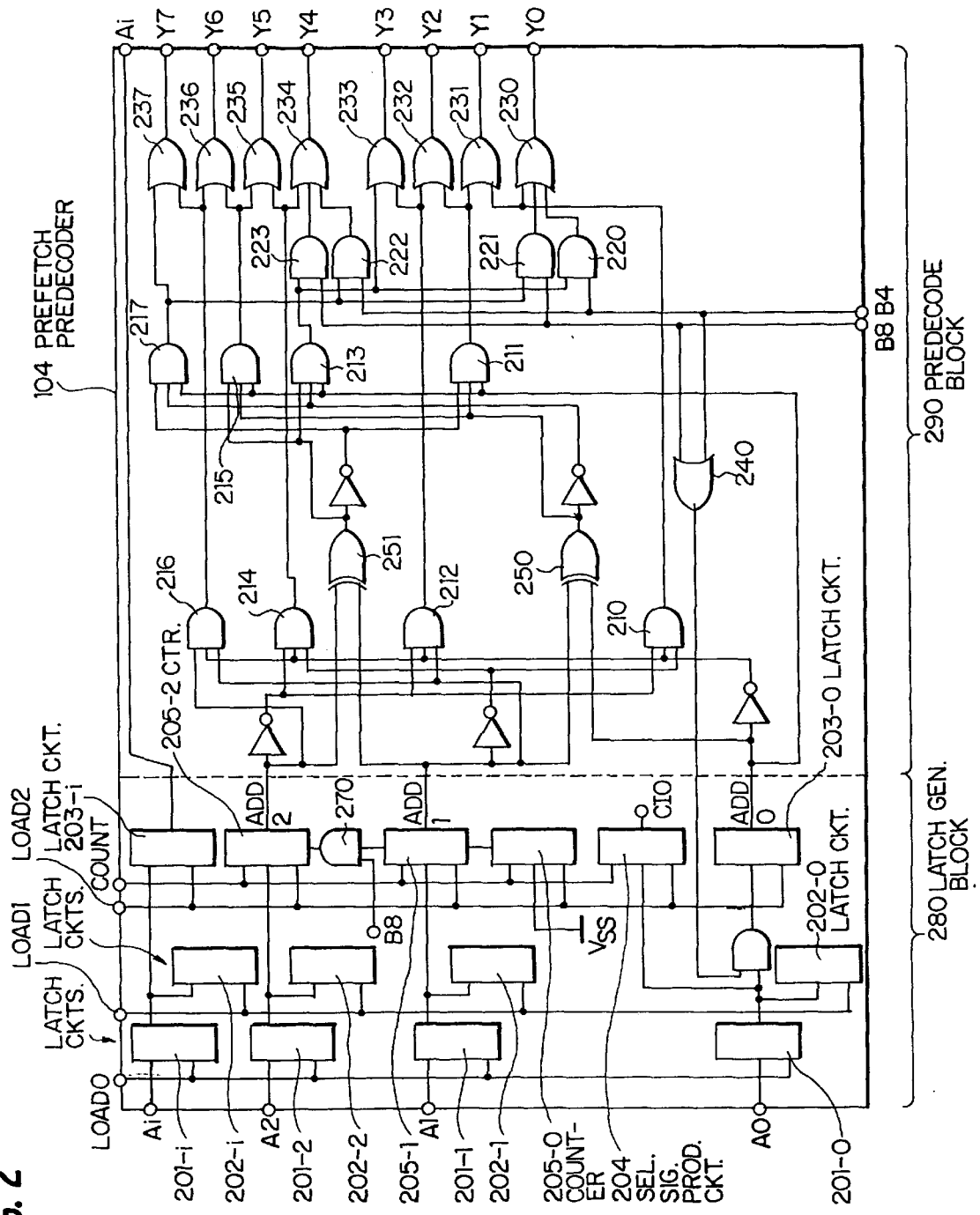
FIG. 2 shows a detailed circuit diagram of a prefetch predecoder 104 indicated in FIG. 1.

Next, compositions of the various circuit portions in this memory circuit 100 will be explained. As illustrated in FIG. 2, the prefetch predecoder 104 is constructed of an address latch generator block 280 and a predecoder block 290. Upon receipt of column addresses A0 to A8, the address latch generator block 280 generates internal address signals ADD 0 to ADD 2 based on the three lower-digit bits A0 to A2 of these column addresses A0 to A8. It should be noted that symbol "Ai" represents A3 to A8. Upon receipt of the internal address signals ADD 0 to ADD 2, the predecode block 290 generates predecode address signals Y0 to Y7.

In FIG. 2, reference numerals 201 to 203 indicate latch circuits, reference numeral 204 shows a selection signal producing circuit, and reference numeral 205 is a counter. The latch circuit 201 is constructed of nine latch circuits 201-0 to 201-8. In this drawing, such latch circuits 201-3 to 201-8 for receiving the column addresses A3 to A8 are indicated as a 201-$i$ in the combined form. Similarly, although the latch circuit 202 is arranged by nine latch circuits 202-0 to 202-8, the latch circuits 202-3 to 202-8 are indicated as 202-$i$ in the combined form. The latch circuit 203 is constructed of seven latch circuits 203-0, and 203-3 to 203-8. When a LOAD 0 signal becomes an active level, the latch circuit 201 fetches address value. When a LOAD 1 signal becomes an active level, the latch circuit 202 fetches address value. When a LOAD 2 signal becomes an active level, both of the latch circuit 203 and the selection signal producing circuit 204 fetch address value. The counter 205 is a 3-bit counter and is arranged by count latch circuits 205-0, 205-1 and 205-2 to which weights of 1, 2, 4 are added respectively. In other words, the counter 205 corresponds to such a 3-bit counter for counting 0 to 7. Both of the LOAD 2 signal and a COUNT signal are supplied to the counter 205. In response to the active level of the LOAD 2 signal, the counter 205 fetches address value and counts up stored value in response to the COUNT signal.

It should be noted that the carry operation from the count latch circuits 205-1 to the count latch circuit 205-2 is performed via a AND gate 270 as shown in FIG. 2. When a level of a burst signal B8 inputted into this AND gate 270 is at "1" (high level), this burst signal B8 indicates that the burst length is 8. As a result, the carry operation from the count latch circuit 205-1 to the count latch circuit 205-2 is not carried out except that the burst length is 8. Similarly, when a level of a burst signal B4 becomes "1" (high level), this burst signal B4 indicates that the burst length is 4. When levels of burst signals B4 and B8 are at "0" (low level), these burst signals represent that the burst lengths are 2. Also, the COUNT signals is supplied to the selection signal producing circuit 204, and the data stored in this selection signal producing circuit 204 is inverted every time the COUNT signal becomes active.

Figure 3:
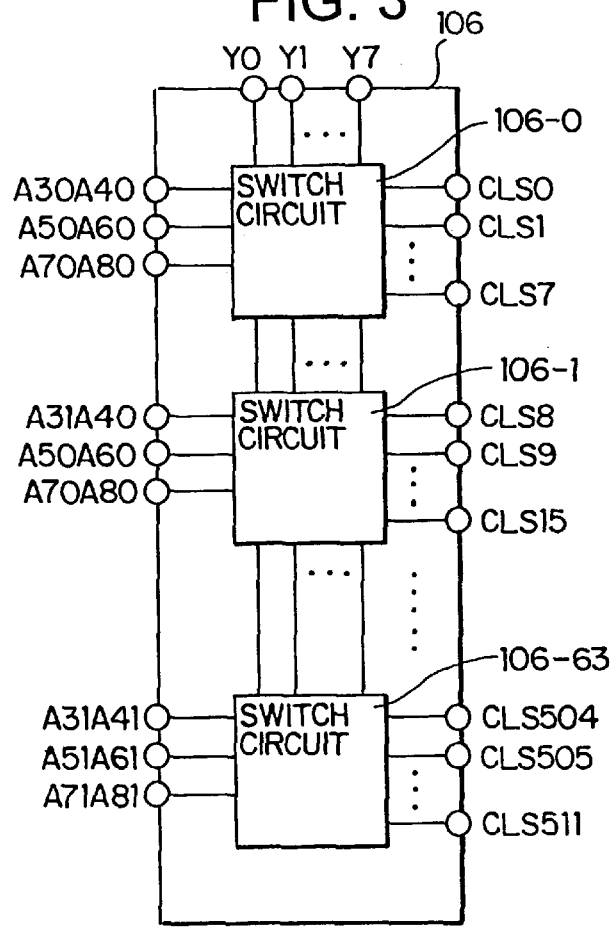
FIG. 3 shows a detailed circuit diagram of a column decoder 106 indicated in FIG. 1.

As represented in FIG. 3 the column decoder 106 is constructed of 64 switch circuits 106-0 to 106-63. To each of these 64 switch circuits, the three corresponding decode signals are supplied from the predecoder 105 and predecode address signals Y0 to Y7 from the prefetch predecoder 104 are commonly supplied.

Figure 4:
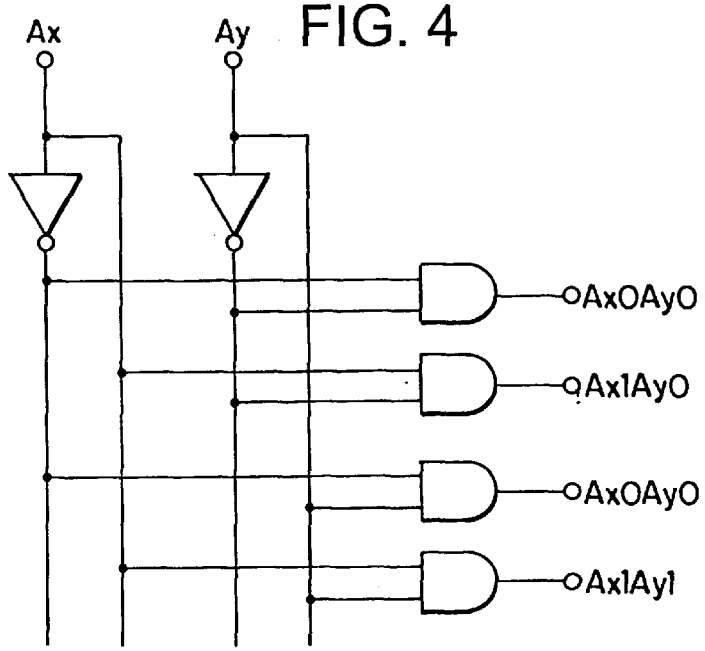
FIG. 4 shows a detailed circuit diagram of a portion of a predecoder 105 indicated in FIG. 1.

Symbols Ax and Ay shown in FIG. 4 are column address signals A3 and A4, or column address signals A5 and A6, or column address signals A7 and A8. The three sets of column addresses are decoded respectively to produce decode signals Ax0Ay0, Ax1Ay0, Ax0Ay1, and Ax1Ay1. As a consequence, the decode signal becomes 12 bits signal. Accordingly, in the column decoder 106 to which this decode signal is supplied, there is only one switch circuit to which all of the three decode signals are "1" (high levels) among the 64 switch circuits 106-0 to 106-63.

Figure 5:
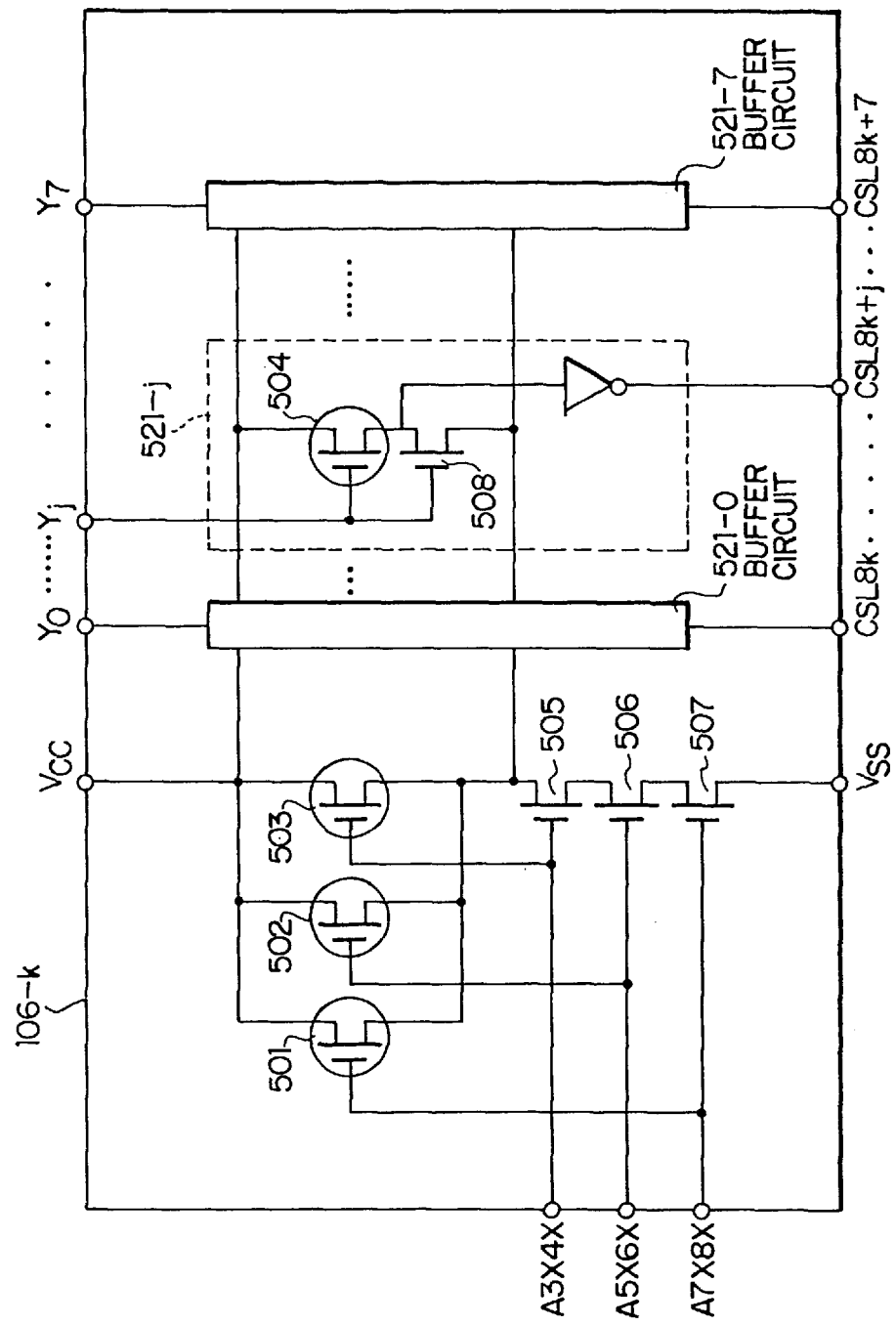
FIG. 5 shows a detailed circuit diagram of a column decoder 106 indicated in FIG. 3.

The switch circuits will now be explained more in detail. As indicated in FIG. 5, each of the switch circuits 106-$k$ includes NAND circuits constructed of P-channel MOS transistors 501 to 503 and N-channel MOS transistors 505 to 507, and buffer circuits 521-0 to 521-7 corresponding to the predecode addresses Y0 to Y7. Each of these buffer circuits contains a P-channel MOS transistor 504 and an N-channel MOS transistor 508, which are series-connected between the power supply potential (Vcc) and the output terminal of the NAND circuit, as typically represented by 521-$j$. As a consequence, when the levels of all decode signals A3XA4X, A5XA6X, A7XA8X become "1" (high levels), the switch circuits are activated and then the predecode address signals Y0 to Y7 are outputted via the buffer circuits 521-0 to 521-7 to the corresponding column selection lines CSLs. If at least one of these decode signals A3XA4X, A5XA6X, and A7XA8X becomes "0" (low level), then the switch circuit are not activated, and the buffer circuits 520 to 527 continuously output 0. As previously explained, since only one switch circuit is activated, the column selection lines CSLs which become high levels correspond to the predecode addresses Y0 to Y7 in the activated switch circuit.

Figure 6:
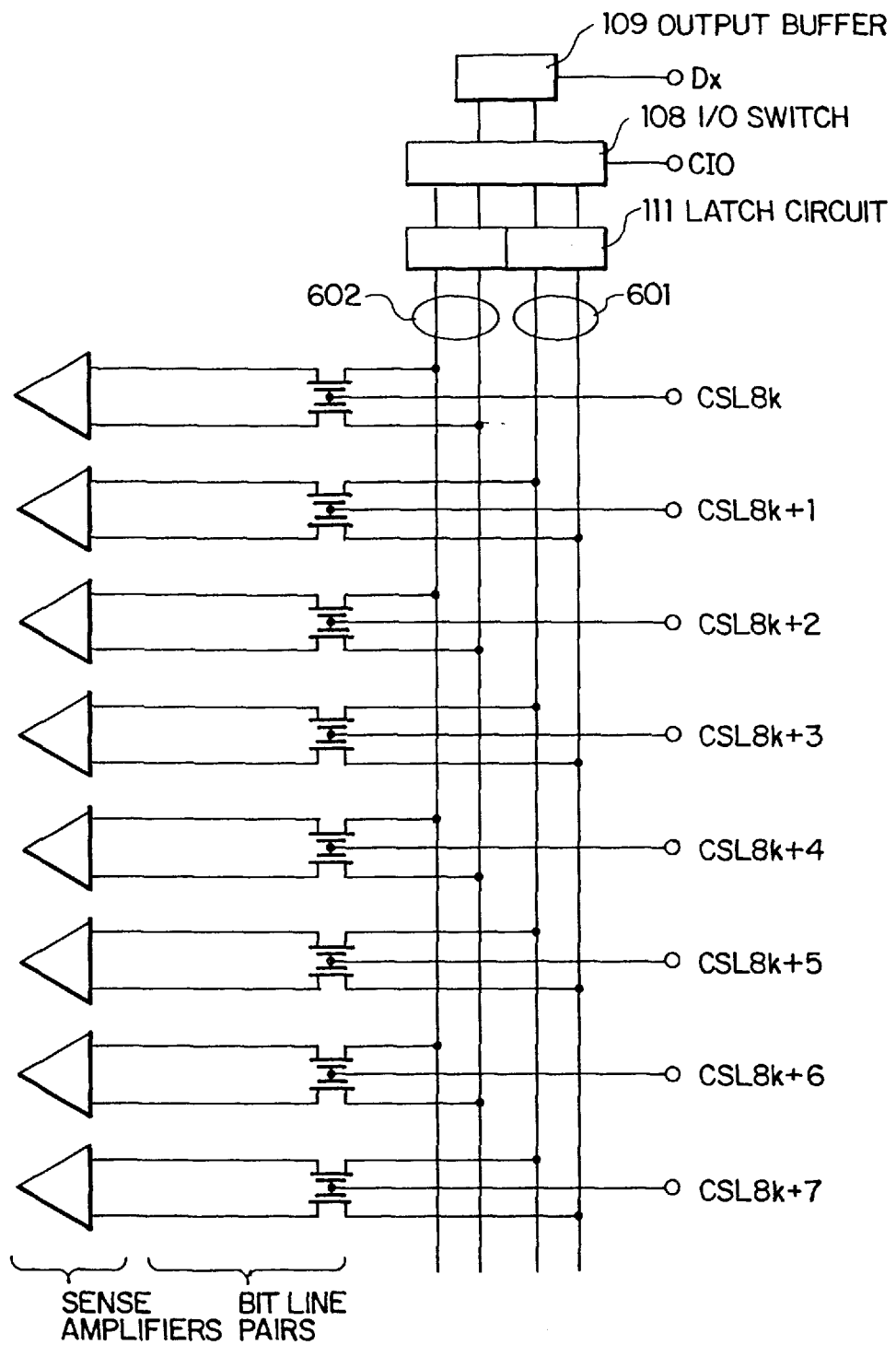
FIG. 6 shows a detailed circuit diagram of a connection relationship between column selection lines and bit lines employed in the 16 Mbit DRAM 100 indicated in FIG. 1.

A connection relationship between the column selection lines CSLs and the bit lines is illustrated in FIG. 6. It should be understood that as explained above, since the data width of the 16 Mbit DRAM 100 is 8 bits, 8 pairs of bit lines are selected by one column selection line CSL, and only 1 bit of data width is shown in this FIG. 6. In FIG. 6, reference numerals 601 and 602 show a pair of I/O buses corresponding to the input/output terminal Dx, and the adjoining bit lines are connected to an I/O bus pair different from each other.

Next, read operations of the 16 Mbit DRAM 100 will now be described with respect to operations of the prefetch predecoder 104 as a major subject. The following descriptions are such cases that the entered address signals A2, A1, A0 are 0, 1, 1 (3), and the burst lengths are selected to be 2, 4, 8.

Figure 7:
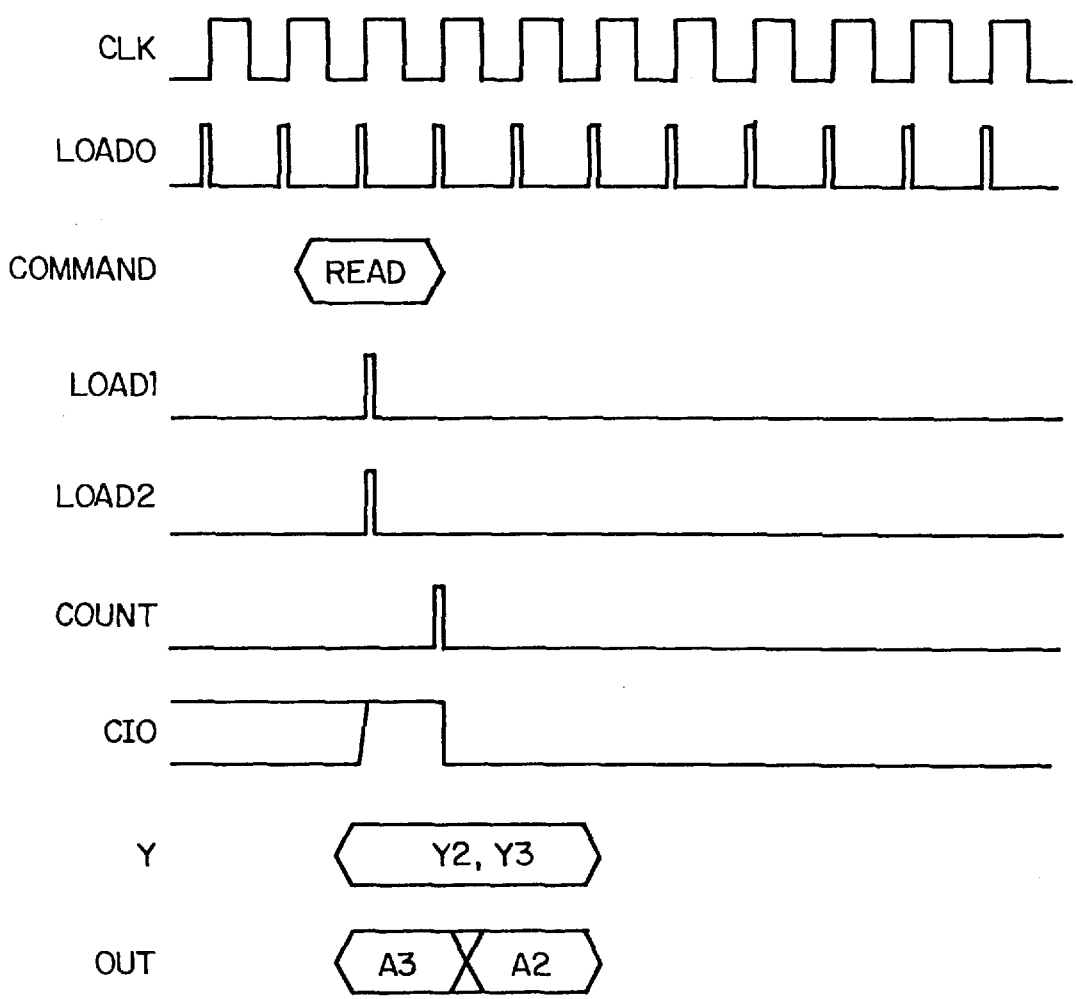
FIG. 7 shows a read timing chart of the 16 Mbit DRAM indicated in FIG. 1, in which the burst length is selected to be 2.

A first description is made on operations of this prefetch predecoder 104 when the burst length is 2 (B4=0, B8=0) with reference further to a timing chart of FIG. 7. First, the column address signals A0 to A8 supplied to the prefetch predecoder 104 are latched by the latch circuit 201 in response to the generation of the LOAD 0 signal. As a result, 0, 1, 1 are stored into the latch circuits 201-2, 201-1, 201-0, respectively. Subsequently, when a READ command is supplied which are made by combining a CS signal, an RAS signal, a CAS signal, and a WE signal that are externally supplied, the LOAD 1 signal and the LOAD 2 signal are produced. Then, the column address signals A0 to A8 are latched by the latch circuit 202. The column address signals A3 to A8 among these column address signals A0 to A8 are also latched by the latch circuit 203-i, whereas the column address signals A2, A1, A0 are also latched by the count latch circuits 205-2, 205-1 and the selection signal producing circuit 204, respectively. Since both of the burst signals B4 and B8 are "0", the output from the OR gate 240 becomes "0". Therefore, the latch circuit 203-0 latch "0" in response to the LOAD 2 signal irrelevant to the value of the column address signal A0. Also, since the power source potential Vss is connected to the input terminal of the counter latch circuit 205-0, the initial value is 0. It should be noted that the latch circuit 202 is employed so as to detect an end when an interleave access operation is performed. As the above-described data are latched by the respective latch circuits and count latch circuits, only the output from the AND gate 212 becomes 1, and the outputs from other AND gates 210, 211, 213 to 223, employed in the predecode block 290 become 0. As a consequence, the predecode address signals Y2 and Y3 become 1 and other predecode address signals become 0.

The column address signals A3 to A8 latched by the latch circuit 203-i are supplied to the predecoder 105 to thereby produce such a decode signal as described above. Accordingly, the column decoder 106 activates the two column selection lines CSLs corresponding to the predecode address signals Y2 and Y3 and output signal of the predecoder 105. On the other hand, the row decoder 103 selects one word line in response to the row address signals A0 to A11.

Since one word line and two CSLs are selected by the above-described operations, 16 memory cells are accessed, 16-bit data is latched by the latch circuit 111 and then is supplied to the I/O switch 108. At this time, since the selection signal CIO is "1", the 8-bit data is selected which corresponds to the predecode address Y3 among the 16-bit data as an odd numbered address supplied to the I/O switch 108, and this selected 8-bit data is supplied to the output buffer 109. Thereafter, in correspondence with the burst length of 2, the clock generator 107 generates the COUNT signal one time after the LOAD 1 signal and the LOAD 2 signal have been produced. Since this COUNT signal is produced, the selection signal CIO is inverted into "0", so that the 8-bit data corresponding to the predecode address Y2 as an even numbered address is selected to be supplied to the output buffer 109. After all, in this case, the data which have been stored in the column addresses of - - - 011 (3), - - - 010 (2) are sequentially outputted.

Figure 8:
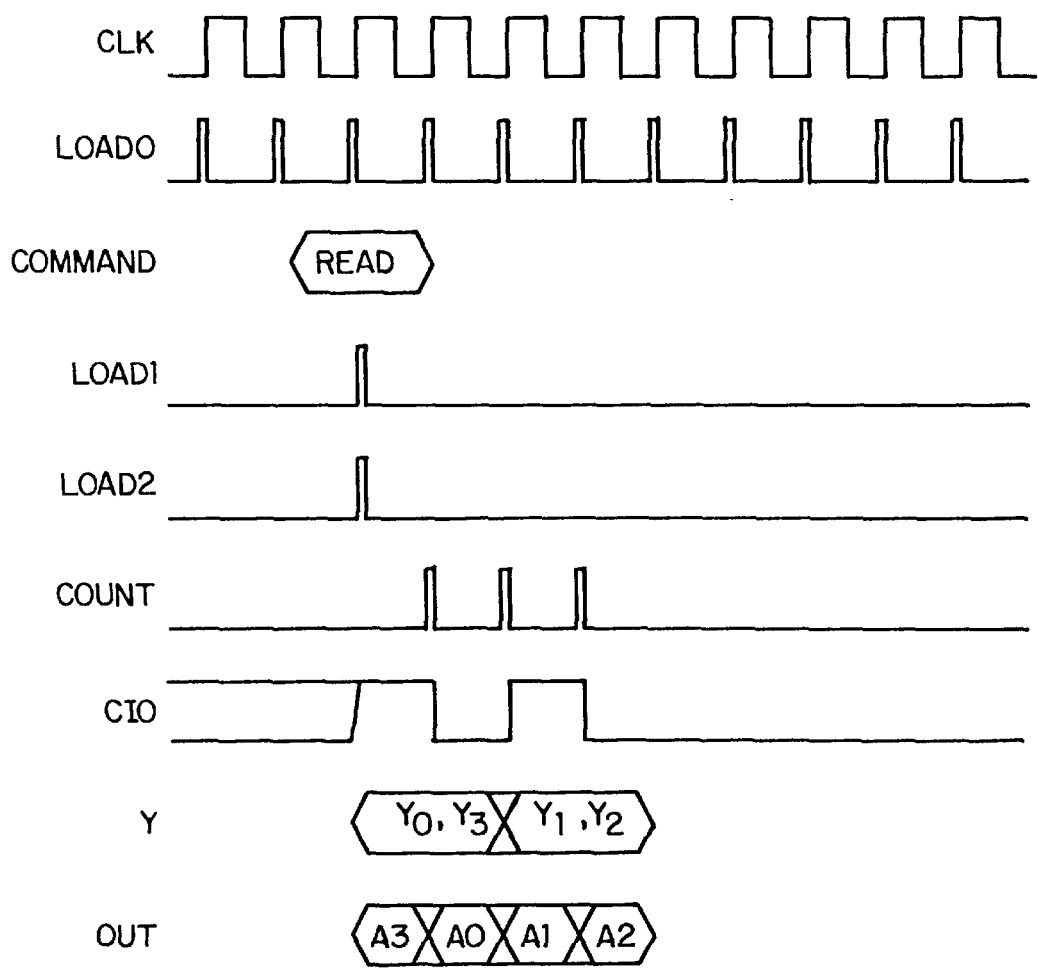
FIG. 8 shows another read timing chart of the 16 Mbit DRAM indicated in FIG. 1, in which the burst length is selected to be 4.

Subsequently, read operations will now be explained in such a case that the burst length is 4 (B4=1, B8=0) with reference to a timing chart of FIG. 8. In this case, since the output from the OR gate 240 is "1", the column address signal A0 is latched by the latch circuit 203-0 in response to the LOAD 2 signal. The same data as in the previous case that the burst length is 2 have been stored in the selection signal producing circuit 204, and other latch circuits and counter latch circuits. Under these circumstances, exclusive OR gates 250 and 251 output "0" and "1", respectively, and an AND gate 213 outputs "1". At this time, since the burst signal B4 is equal to 1, an AND gate 220 also outputs "1". As a consequence, the predecode address signals Y0 and Y3 become "1", and other predecode address signals become "0".

Operations of the predecoder 105 and the row decoder 103 are identical to those when the burst length is 2.

As a result, since one word line and two column selection lines are selected, 16 memory cells corresponding to the predecode address signals Y0 and Y3 are read and then are latched in the latch circuit 111. As described above, in response to the selection signal CIO supplied to the I/O switch 108, the 8-bit data corresponding to the predecode address Y3 is first selected to be outputted to the output buffer 109. In response to the burst length of 4, the clock generator 107 generates the COUNT signal three times in synchronism with the clock after the LOAD 1 signal and the LOAD 2 signal are produced.

First, in response to the first generation of the COUNT signal, the selection signal CIO is inverted into "0", so that the I/O switch 108 is selected and the 8-bit data corresponding to the predecode address of Y0. In response to the second generation of the COUNT signal, "0", "0", and "0" are stored into the counter latch circuits 205-2, 205-1, and 205-0, respectively, and then the AND gate 211 outputs "1". As a consequence, the predecode address signals Y1 and Y2 become 1 and other predecode address signals become 0. At this time, the selection signal CIO is inverted twice and is returned to 1. Accordingly, the I/O switch 108 selects the 8-bit data corresponding to the predecode address Y1 to output the selected 8-bit data. Then, when the third COUNT signal is produced, the selection signal CIO is inverted into 0, so that the I/O switch 108 is selected to be switched to the 8-bit data corresponding to the predecode address Y2. After all, the data stored in the column addresses of - - - 011 (3), - - - 000 (0), - - - 001 (1), - - - 010 (2) are sequentially outputted.

Figure 9:
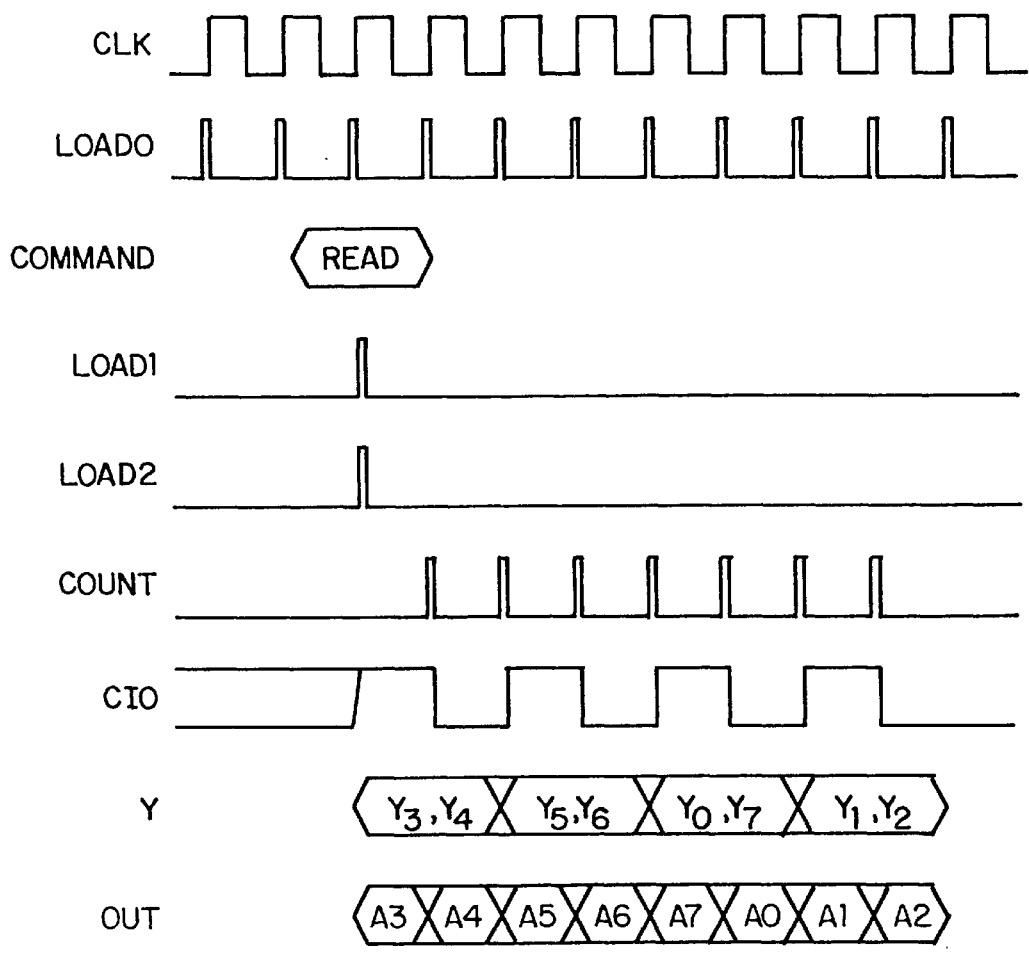
FIG. 9 shows still another read timing chart of the 16 Mbit DRAM 100 shown in FIG. 1, in which the burst length is selected to be 8.

Furthermore, read operations will now be explained when the burst length is 8 (B4=0, B8=1) with reference to a timing chart shown in FIG. 9. In this case, the clock generator 107 generates the COUNT signals seven times in response to the clock after the LOAD 1 signal and the LOAD 2 signal are produced. However, since the output from the OR gate 240 is "1", conditions of the latch circuits before the COUNT signals are generated are the same as in the previous case that the burst length is 4. As a consequence, although the AND gate 213 outputs 1, the burst signal B4 is 0 and the burst signal B8 is 1, so that the output from the AND gate 223 becomes 1, and the predecode address signals Y3 and Y4 become 1.

Also, as the burst signal B8 is equal to 1, the AND gate 270 is brought into the active state, so that the second COUNT signal is produced and thus the carry operation of the counter 265 is performed up to the count latch circuit 205-2. Accordingly, in response to the generation of the second COUNT signal, the predecode addresses to be selected are Y5 and Y6. In response to the generation of the fourth COUNT signal, the predecode addresses to be selected are Y0 and Y7. Then, in response to the generation of the sixth COUNT signal, the predecode addresses to be selected are Y1 and Y2. As a result, the I/O switch 108 first selects the 8-bit data corresponding to the predecode address Y3, and subsequently selects the 8-bits data corresponding to the predecode addresses Y4, Y5, Y6, Y7, Y0, Y1, and Y2 every time the COUNT signal is generated. After all, the data stored in the column addresses of - - - 011 (3), - - - 100 (4), - - - 101 (5), - - - 110 (6), - - - 111 (7), - - - 000 (0), - - - 001 (1), - - - 010 (2) are sequentially outputted.

As described above, the prefetch predecoder 104 changes the predecode address signals Y selected by the inputted address signals A0 to A2 in accordance with the burst lengths. The respective entered address signals A0 to A2 and the predecode address signals selected based on the respective burst lengths are represented in FIG. 10.

As previously explained, since the memory circuit according to this embodiment employs the prefetch predecoder 104, the below-mentioned access operation can be performed. That is, when the burst length is selected to be 2, the data (CPU instruction) corresponding to the inputted address (CPU address) is first outputted, and subsequently, the data corresponding to such addresses, only the least significant bit (LSB) of which is different from that of the CPU address, are outputted. When the burst length is selected to be 4, the CPU instruction is first commenced to be outputted, and subsequently the data corresponding to such addresses, only two lower-digit bits of which are different from those of the CPU address, are sequentially outputted. When the burst length is selected to be 8, the CPU instruction is first outputted, and then the data corresponding to such addresses, only three lower-digit bits of which are different from those of the CPU address, are sequentially outputted.

In other words, the memory circuit according to this embodiment can satisfy the conditions of the main memory when the cache memory is used. Moreover, since two burst data to be outputted are read out from the memory circuit according to this embodiment, even when the burst length becomes long, the quantity of buses are not required to be increased, which is different from such a memory circuit having a nibble mode function. Additionally, since the two burst data which are read out within one time from the memory circuit of this embodiment are read by simultaneously selecting the two column selection lines CSLs, there is no limitation in combing of the two burst data to be read within one time. Even when any addresses are entered, the data corresponding to the continuous addresses, only several lower-digit bits of which are different from those of the address, can be sequentially outputted in the address order.

Figure 11:
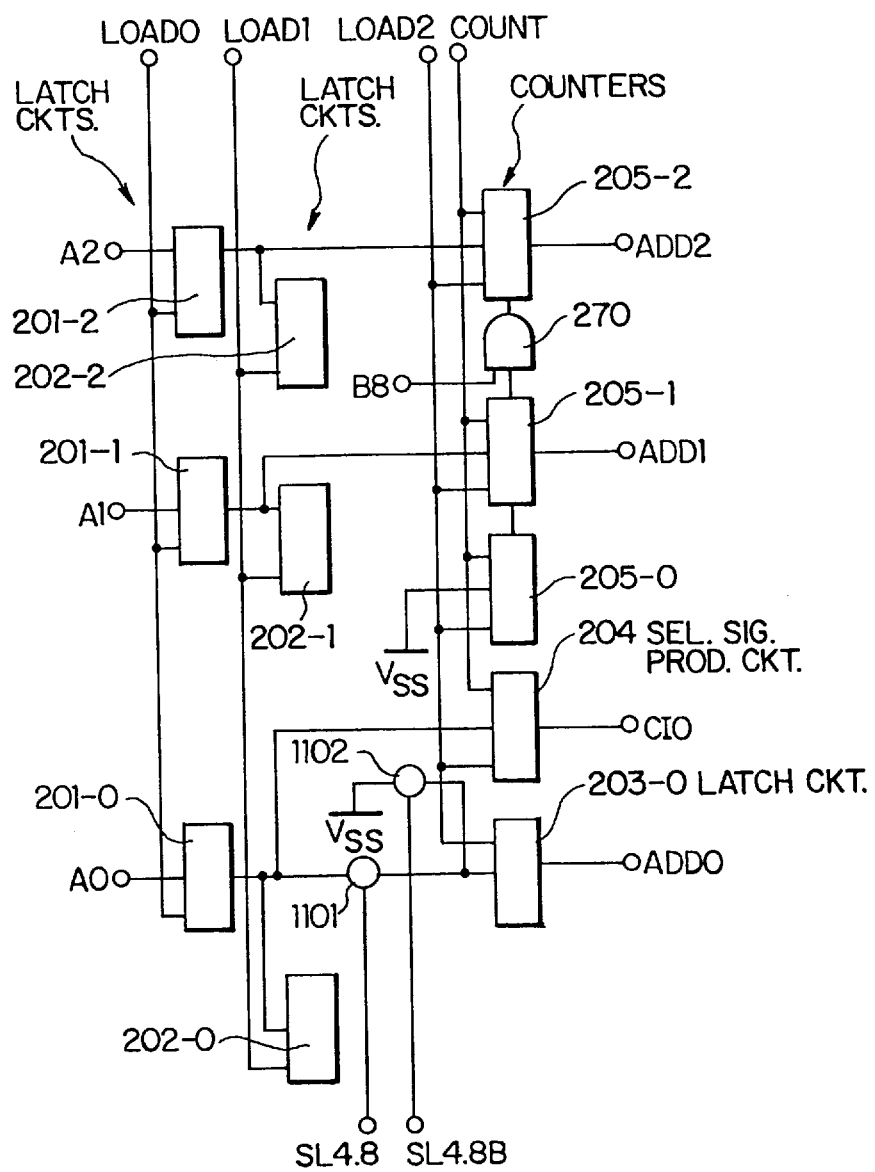
FIG. 11 shows another address latch generator block 281.

It should be noted that the address latch generator block 280 shown in FIG. 2 may be substituted by an address latch generator block 281 shown in FIG. 11. Switches 1101 and 1102 of this address latch generator block 281 are employed so as to substitute the AND gate 260 of the address latch generator block 280 shown in FIG. 2. The address latch generator block 281 owns the same function as that of the above-described address latch generator block 280 shown in FIG. 2. It should be noted that since the circuit portions related to the address signals A3 to A8 corresponding to the upper-digit bits of the column addresses are identical to those of FIG. 2, these circuit portions are omitted. In this drawing, a burst signal SL4,8 is such a signal which becomes "1" (high levels) when the burst length is equal to 4 or 8. A burst signal SL4,8B is an inverted signal with respect to the burst signal SL4,8. The switches 1101 and 1102 are turned ON when these burst signals are "1", and are turned OFF when these burst signals are "0". As a result, when the burst length is 2, a VSS potential (0) is latched in the latch circuit 203-0. When the burst length is 4, or 8, the data of A0 is latched in this latch circuit 203-0. There is such a merit that when the address latch generator block 281 is employed, no OR gate 240 of the predecode block 290 is longer required.

Figure 12:
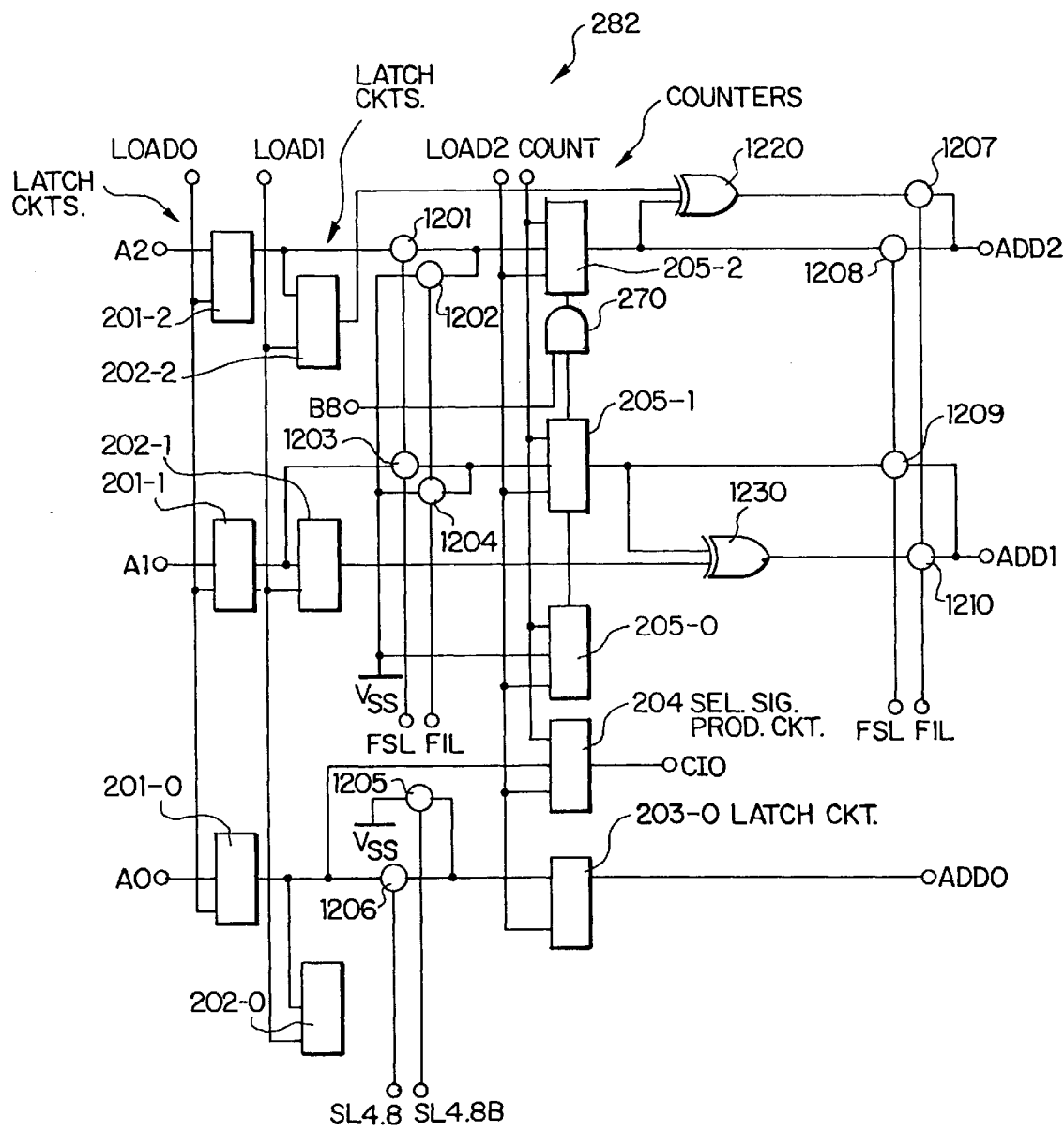
FIG. 12 shows still another address latch generator block 282.

Furthermore, the address latch generator block 280 may be substituted by an address latch generator block 282 shown in FIG. 12. It should be noted that as similar to the address latch generator block 281 shown in FIG. 11, since the circuit portions related to A3 to A8 corresponding to the upper-digit bits of the column address are completely identical to those of the address latch generator block 280, these circuit portions are omitted. The address latch generator block 282 shown in FIG. 12 can perform an interleave access operation other than the above-explained sequential access operation. The sequential access operation and the interleave access operation are switched in response to access control signals FSL and FIL. In other words, when the access control signal FSL becomes "1" (high level) and the access control signal FIL becomes "0" (low level), the sequential access operation is carried out. When the access control signal FSL becomes "0" (low level) and the access control signal FIL becomes "1" (high level), the interleave access operation is performed. In this drawing, switches 1201 to 1210 own the same functions as those of the switches 1101 and 1102 shown in FIG. 11.

When the sequential access operation is carried out, the switches 1201, 1203, 1208, and 1209 are turned ON whereas the switches 1202, 1204, 1207, and 1210 are turned OFF. Therefore, this address latch generator block 282 performs the same operation as that of the previous address latch generator block 281 shown in FIG. 11. On the other hand, in case of the interleave access operation, conversely, since the switches 1201, 1203, 1208 and 1209 are turned OFF and the switches 1202, 1204, 1207 and 1210 are turned ON, the initial values of the count latch circuits 205-0, 205-1, 205-2 are necessarily at the VSS potential (0). Furthermore, the data latched in the latch circuits 205-1 and 205-2 do not directly constitute the internal address signals ADD 1 and ADD 2 which are different from that of the sequential access operation, but these data exclusive-OR-gated with the data latched by the latch circuits 202-1 and 202-2, respectively to obtain the internal address signals ADD 1 and ADD 2.

Figure 13:
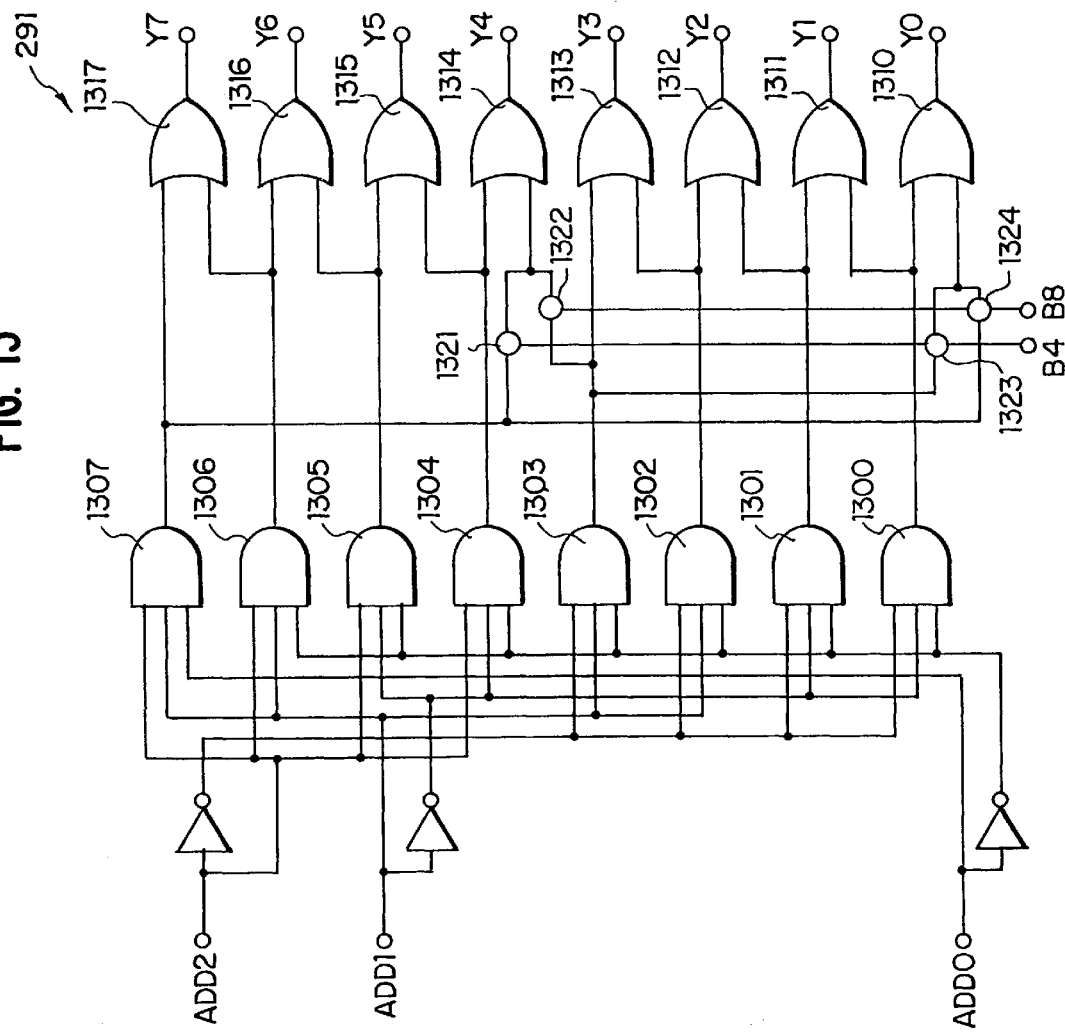
FIG. 13 shows another predecode block 291.

On the other hand, the predecode block 290 shown in FIG. 2 may be alternatively realized by employing a predecode block 291 shown in FIG. 13. That is, this predecode block 291 shown in FIG. 13 has the following different points. A method for decoding internal address signals ADD 0 to ADD 2 derived from the address latch generator block is different from the decoding method shown in FIG. 2. Furthermore, the AND gates 220 to 223 are substituted by switches 1321 to 1324. Although this predecode block 291 owns the same function as that of the predecode block 290 shown in FIG. 2, since the circuit arrangement of the predecode block 291 shown in FIG. 13 can be made simple, this circuit block 291 can be further integrated in higher density.

Next, a memory circuit according to another embodiment of the present invention will now be described.

Figure 14:
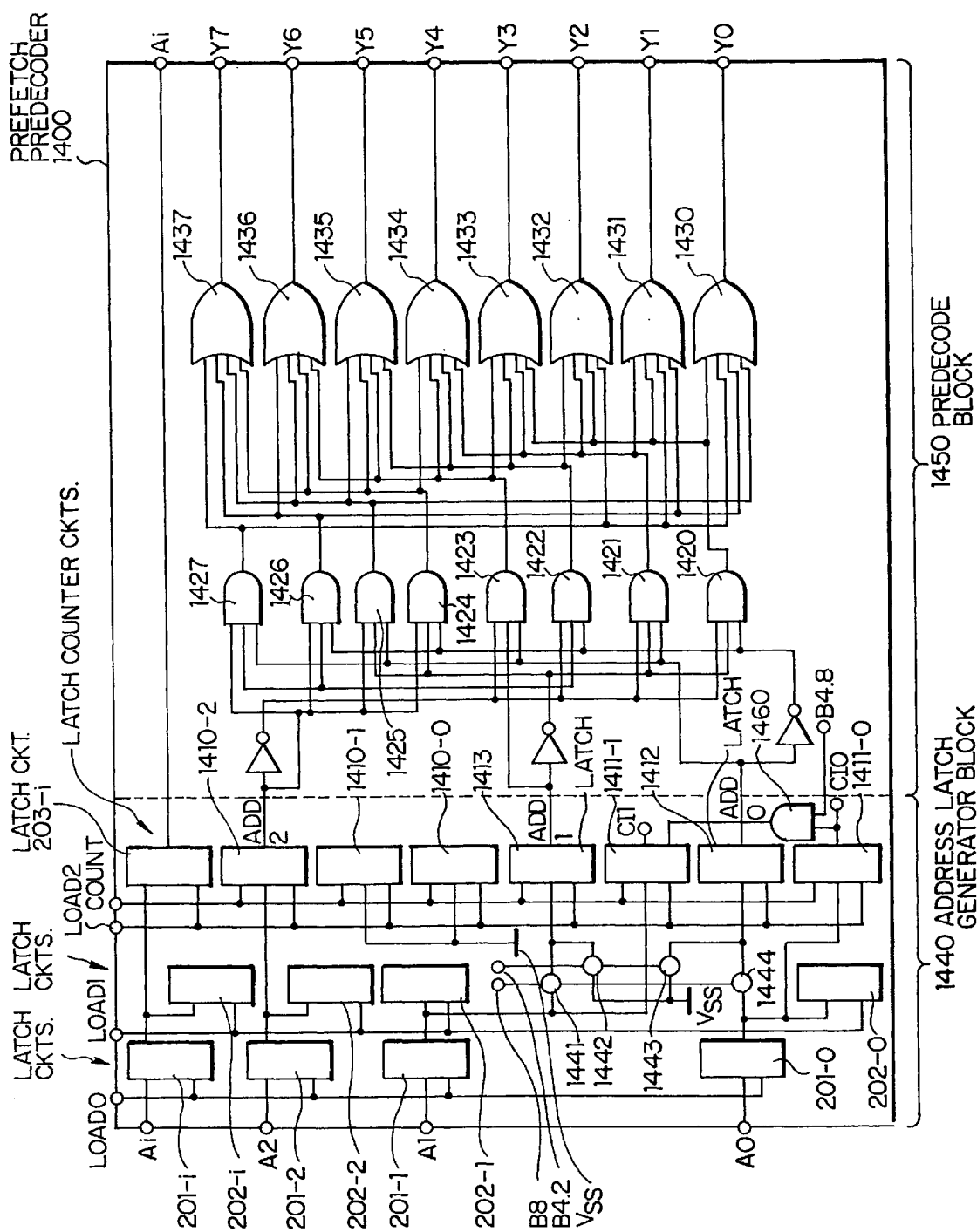
FIG. 14 shows still another prefetch decoder 1400 employed in a memory circuit according to another embodiment of the present invention.

In accordance with the memory circuit of this embodiment, two burst data are not read out within one time (namely, 2-bit prefetch), but four burst data are read out within one time (namely, 4-bit prefetch). The memory circuit of this embodiment may be realized by that such a prefetch predecoder 1400 as indicated in FIG. 14 is employed instead of the above-explained prefetch predecoder 104 employed in the 16 Mbit DRAM 100 shown in FIG. 1, and also a switch capable of selecting 4 burst data is used as the I/O switch 108. Similar to the prefetch predecoder 104, the prefetch predecoder 1400 produces predecode address signals Y0 to Y7 upon receipt of the three lower-digit bits of the column address signal. Since this prefetch predecoder 1400 selects four predecode addresses signals from Y0 to Y7, the column decoder 106 selects four column selection lines CSLs from 512 column selection lines, so that 32 memory cells are read out at the same time.

The prefetch predecoder 1400 is arranged by an address latch generator block 1440 for generating internal address signals ADD 0 to ADD 2 in response to three lower-digit bits of the column address signal, and also a predecode block 1450 for producing the predecode addresses Y0 to Y7 in response to the internal address signals ADD 0 to ADD 2. In FIG. 14, reference numerals 201 to 203, 1412 and 1414 are latch circuits, reference numerals 1411 shows selection signal producing circuits, and reference numerals 1441 to 1444 indicate switches. It should be noted that the selection signal producing circuit 1411 is such a 2-bit counter constructed of counter latch circuits 1411-0 and 1411-1, and this 2-bit counter stores the data in response to the LOAD 2 signal, and counts up in response to the COUNT signal. Note that the carry operation from the count latch circuits 1411-0 to 1411-1 is performed via an AND gate 1460. The burst signal B8 becomes 1 (high level) when the burst length is 8. The burst signal B4,2 becomes 1 when the burst length is 4 or 2. Then, the burst signal B4,8 become 1 when the burst length is 4 or 8.

Concrete operations of this embodiment will now be described with reference to such examples that the addresses A2, A1, A0 entered into the prefetch predecoder 1400 are 0, 1, 1 (3), respectively, and burst lengths are selected to be 2, 4 and 8, respectively.

First, a description is made on such a case that the burst length is 2(B8=0, B4,2=1, B4,8=0). First, the column addresses A0 to A8 supplied from the address buffer 102 are latched by the latch circuit 201 in response to the generation of the LOAD 0 signal. Accordingly, 0, 1, 1 are stored into the latch circuits 201-2, 201-1, 201-0, respectively. Since the switches 1442 and 1443 are turned ON, the VSS potential (0) is latched in the latch circuits 1412 and 1413. As a result, the AND gate 1420 outputs "1". Thus, the predecode address signals to be selected become Y0, Y1, Y2 and Y3. Based on these produced predecode address signals, the four column selection lines CSLs corresponding thereto are selected and 32-bit data is latched into the latch circuit 111.

On the other hand, since the column addresses A0 and A1 have been stored into the count latch circuits 1411-0 and 1411-1 for constituting the counter 1411, the selection signals CI0 and CI1 are commonly "1". These selection signals are supplied to the I/O switch 108. Upon receipt of these selection signals, the I/O switch 108 selects the 8-bit data corresponding to the predecode address Y3 from the 32-bit data and supplies the selected 8-bit data to the output buffer 109. Thereafter, since the data stored in the count latch circuit 1411-0 is inverted every time one COUNT signal is generated, the selection signal CIO is also inverted to become "0" (low level). However, as the burst signal B4,8 is "0" and the AND gate 1460 outputs "0", no carry operation is performed to the count latch circuit 1411-1, so that the selection signal CI1 is not inverted. As a consequence, since the COUNT signal is produced, the selection signals CI1 and CI0 become 1 and 0, respectively the I/O switch 108 selects the 8-bit data corresponding to the predecode address signal Y2 and outputs this selected 8-bit data to the output buffer 109. After all, the data stored in the column addresses of - - - 011 (3), - - - 010 (2) are sequentially outputted.

Also when the burst length is 4, the AND gate 1420 outputs "1" and the predecode address signals to be selected become Y0, Y1, Y2 and Y3. Although both of the selection signals CI1 and CI0 are "1", since the carry operation to the count latch circuit 1411-1 is performed when the burst length is 4, the value ("1,1", at beginning) of the counter 1411 is changed into "0,0", "0,1", and "1,1" in response to the three generations of the COUNT signal. The I/O switch 108 first selects the 8-bit data corresponding to the predecode address signal Y3, and sequentially selects the predecode address signals Y0, Y1, Y2 in this order in response to the COUNT signal. Eventually, the data stored in the column addresses of - - - 011(3), - - - 000(0), - - - 001(1), - - - 010(2) are sequentially outputted.

On the other hand, when the burst length is 8, since both of the switches 1441 and 1444 are turned ON, the column addresses A0 and A2 are stored into the latch circuits 1412 and 1413, respectively. As a result, in this case, "1" is stored into the latch circuits 1412 and 1413, and then the AND gate 1423 outputs "1". Accordingly, the predecode addresses to be selected are Y3, Y4, Y5 and Y6. Thus the read data are sequentially outputted in response to the COUNT signal, as described above. However, when the burst length is 8, since the COUNT signal is generated seven times, the carry operation of the counter 1410 is performed up to the count latch circuit 1410-2 in response to the fourth generation of the COUNT signal. Therefore, the internal address signal ADD 2 is inverted to become "1", so that because the AND gate 1427 outputs "1", the predecode addresses to be selected are changed into Y7, Y0, Y1 and Y2. Similarly, these predecode addresses are sequentially outputted in response to the COUNT signal. After all, the data stored in the column addresses of - - - 011 (3), - - - 100 (4), - - - 101 (5), - - - 110 (6), - - - 111 (7), - - - 000 (0), - - - 001 (1), - - - 010 (2) are sequentially outputted.

As previously explained in detail, the memory circuit according to this embodiment owns a similar function to that of the memory circuit according to the above-described embodiment. Further, the 32-bit data are read out within one time by simultaneously selecting the four column selection lines CSLs. As a consequence, the data can be read out from the memory circuit faster than in the previous embodiment in which the 16-bit data are read out.

What is claimed is:

1. A memory circuit comprising:
   a memory cell array including a plurality of memory cells each coupled to a corresponding one of a plurality of word lines and a corresponding one of a plurality of column selection lines, said plurality of column selection lines being divided into first and second groups, a row decoder circuit decoding a row address and selecting one of said plurality of word lines, a predecode circuit decoding a part of a column address and a burst signal and generating first and second predecode signals and a selection signal, a first column decoder circuit decoding a remaining part of said column address and said first predecode signal and selecting a first one of said column selection lines belonging to said first group, a second column decoder circuit decoding said remaining part of said column address and said second predecode signal and selecting a second one of said column selection lines belonging to said second group, a latch circuit latching first data read out from a first one of said memory cells which is coupled to said one of said word lines and said first one of said column selection lines and second data out read from a second one of said memory cells which is coupled to said one of said word lines and said second one of said column selection lines, and a selection circuit responding to said selection signal and selecting and supplying one of said first and second data latching in said latch circuit to a data terminal.

2. An address decoder decoding an input signal representing an address of a memory cell array, and producing a decoded signal representing a plurality of addresses of said memory cell array, said decoded signal being based on a burst length, said address decoder comprising:

an address latch circuit latching said input signal and producing an intermediate signal, a decode circuit decoding said intermediate signal and producing said decoded signal, and a selection circuit outputting a first selection signal and a second selection signal in sequence;

wherein said selection circuit outputs at least one lower-digit bit of said input signal as said first selection signal, and changes a content of said at least one lower-digit bit of said input signal in response to said burst length to produce said second selection signal; and wherein said first selection signal selects one of said plurality of addresses of said memory cell array and said second selection signal selects another of said plurality of addresses of said memory cell array.

3. The address decoder as claimed in claim 2, further comprising a count circuit changing a content of said intermediate signal that is based on said burst length number.

4. The address decoder as claimed in claim 3, wherein said count circuit increments a value of said input signal which is latched by said address latch circuit.

5. A memory circuit comprising:

a memory cell array including a plurality of memory cells each coupled to a corresponding one of a plurality of column selection lines, a first predecode circuit decoding a column address to produce a predecode signal and a selection signal, said first predecode signal selecting a first part of said plurality of column selection lines, said first part including more than two column selection lines a latch circuit latching data values read out from said memory cells selected by said more than two column selection lines, and a selection circuit responding to said selection signal to select and supply to a data terminal one of said data values latched in said latch circuit.

6. The memory circuit as claimed in claim 5, wherein:

said predecode circuit receives a burst signal representing a burst length;

said predecode circuit produces a second predecode signal in response to said burst signal; and said second predecode signal selects a second part of said plurality of column selection lines different from said first part of said plurality of column selection lines.

* * * * *

UNITED STATES PATENT AND TRADEMARK OFFICE
CERTIFICATE OF CORRECTION

PATENT NO. : 5,815,460
DATED : September 29, 1998
INVENTOR(S) : Hiroshi WATANABE It is certified that error appears in the above-identified patent and that said Letters Patent is hereby corrected as shown below:

On the title page item [30]:

Foreign Application Priority Data: delete "5-146349" and insert --6-146349--.

Column 1, line 66, delete " A9" " and insert --"A9"--.

Column 4, line 4, delete "intermidiate" and insert --intermediate--.

Signed and Sealed this

Eighth Day of June, 1999

Q. TODD DICKINSON

*Attest:*

*Attesting Officer*  Acting Commissioner of Patents and Trademarks